United States Patent
Zhou et al.

(10) Patent No.: US 12,424,283 B2
(45) Date of Patent: Sep. 23, 2025

(54) METHOD FOR CONTROLLING A MEMORY SYSTEM, A MEMORY SYSTEM, AND AN ELECTRONIC DEVICE

(71) Applicant: YANGTZE MEMORY TECHNOLOGIES CO., LTD., Wuhan (CN)

(72) Inventors: Teng Zhou, Wuhan (CN); Hua Tan, Wuhan (CN); Qian Sun, Wuhan (CN); Xiaodong Xu, Wuhan (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 107 days.

(21) Appl. No.: 18/503,644

(22) Filed: Nov. 7, 2023

(65) Prior Publication Data

US 2025/0006262 A1    Jan. 2, 2025

(30) Foreign Application Priority Data

Jun. 29, 2023 (CN) .......................... 202310794482.1

(51) Int. Cl.
*G11C 7/00* (2006.01)
*G11C 16/08* (2006.01)
*G11C 16/26* (2006.01)

(52) U.S. Cl.
CPC .............. *G11C 16/08* (2013.01); *G11C 16/26* (2013.01)

(58) Field of Classification Search
CPC ....... G11C 7/1051; G11C 7/22; G11C 7/1072; G11C 7/1006; G11C 7/1066
USPC .......................... 365/189.15, 189.14, 230.06
See application file for complete search history.

(56) References Cited

U.S. PATENT DOCUMENTS

| | | | |
|---|---|---|---|
| 2016/0163382 A1* | 6/2016 | Conley | G11C 16/3459 365/185.03 |
| 2021/0081275 A1* | 3/2021 | Kumano | H03M 13/3738 |
| 2024/0312552 A1* | 9/2024 | Steiner | G11C 29/024 |

* cited by examiner

*Primary Examiner* — Son T Dinh
(74) *Attorney, Agent, or Firm* — Conley Rose, P.C.

(57) ABSTRACT

In examples, a method of controlling a memory system comprises obtaining a first soft-bit data corresponding to a hard-bit data read from a memory and a first lookup table, where the first lookup table comprises a first log-likelihood ratio determined based on a first reference read voltage of the memory. The method comprises performing a first soft decoding operation according to the first log-likelihood ratio and the first soft-bit data. The method comprises performing at least one shift to the first log-likelihood ratio and performing a second soft decoding operation according to a log-likelihood ratio after each shift and the first soft-bit data when the first soft decoding operation is determined to have failed to decode.

20 Claims, 13 Drawing Sheets

METHOD FOR CONTROLLING A MEMORY SYSTEM, A MEMORY SYSTEM, AND AN ELECTRONIC DEVICE

CROSS-REFERENCE TO RELATED APPLICATIONS

The present application claims priority to Chinese Patent Application No. 2023107944821, which was filed Jun. 29, 2023, is titled "CONTROL METHOD OF MEMORY SYSTEM, MEMORY SYSTEM AND ELECTRONIC EQUIPMENT," and is hereby incorporated herein by reference in its entirety.

TECHNICAL FIELD

The application relates to the technical field of memory—in particular, to a method for controlling a memory system, a memory system, and an electronic device.

BACKGROUND

Storage devices, such as memory, store information in modern information technology. As a typical nonvolatile semiconductor memory, NAND (Not AND) memory has become a mainstream product in the memory market because of its higher storage density, controllable production cost, suitable erasing speed, and maintaining characteristics. In order to improve the error correction ability of memory, the data read from memory is usually decoded by way of combined hard decoding and soft decoding. However, the current soft decoding generally has the problem of low decoding efficiency.

SUMMARY

The implementations of the present application provide a method for controlling a memory system, a memory system, and an electronic device.

The implementations of the present disclosure adopt the following technical schemes:

In one aspect, a method for controlling a memory system is provided. When implementing the method, a first soft-bit data corresponding to a hard-bit data read from a memory and a first lookup table are obtained first. The first lookup table includes a first log-likelihood ratio (LLR) determined based on a first reference read voltage of the memory. Then, a first soft decoding operation is performed according to the first log-likelihood ratio and the first soft-bit data. Finally, at least one shift to the first log-likelihood ratio is performed, and a second soft decoding operation is performed according to the log-likelihood ratio after each shift and the first soft-bit data when the first soft decoding operation is determined to have failed to decode.

In one possible implementation, when performing at least one shift to the first log-likelihood ratio and performing a second soft decoding operation according to the log-likelihood ratio after each shift and the first soft-bit data, at least one positive shift to the first log-likelihood ratio may be performed, and soft decoding may be performed according to the log-likelihood ratio after each shift and the first soft-bit data.

In another possible implementation, when performing at least one positive shift to the first log-likelihood ratio and performing soft decoding according to the log-likelihood ratio after each shift and after the first soft-bit data fails, at least one negative shift to the first log-likelihood ratio may also be performed, and soft decoding may be performed according to the log-likelihood ratio after each shift and the first soft-bit data.

In another possible implementation, when performing at least one shift to the first log-likelihood ratio and performing a second soft decoding operation according to the log-likelihood ratio after each shift and the first soft-bit data, at least one negative shift to the first log-likelihood ratio may also be performed, and soft decoding may be performed according to the log-likelihood ratio after each shift and the first soft-bit data.

In another possible implementation, when performing at least one negative shift to the first log-likelihood ratio and performing soft decoding according to the log-likelihood ratio after each shift and the first soft-bit data fails, at least one positive shift to the first log-likelihood ratio may also be performed, and soft decoding may be performed according to the log-likelihood ratio after each shift and the first soft-bit data.

In another possible implementation, when performing at least one shift to the first log-likelihood ratio and performing a second soft decoding according to the log-likelihood ratio after each shift and the first soft-bit data, cross-shift to the first log-likelihood ratio may also be performed and soft decoding may be performed according to the log-likelihood ratio after each shift and the first soft-bit data.

In another possible implementation, the value of each shift is the same when performing at least one shift to the first log-likelihood ratio.

In another possible implementation, the value of each shift is different when performing at least one shift to the first log-likelihood ratio.

In another possible implementation, after stopping the performing of the second soft decoding operation when a count of shifts to the first log-likelihood ratio reaches a preset value, the above method further comprises obtaining a second lookup table comprising a second log-likelihood ratio determined based on a second reference read voltage of the memory. Then, the first reference read voltage is offset to the second reference read voltage. Finally, a second soft-bit data of the memory may be read according to the second reference read voltage, and a third soft decoding operation may be performed according to the second soft-bit data and the second log-likelihood ratio.

In another possible implementation, after stopping the second soft decoding operation when a count of shifts to the first log-likelihood ratio reaches a preset value, the method further comprises obtaining a third lookup table comprising a third log-likelihood ratio determined based on a third reference read voltage and performing a fourth soft decoding operation according to the third log-likelihood ratio and the first soft-bit data.

In another possible implementation, a first soft-bit data corresponding to a hard-bit data read from the memory and a first lookup table is obtained after a hard decoding operation on the hard-bit data fails to decode.

A second aspect of the present application includes a computer-readable storage medium storing computer program instructions. The computer program instructions, when executed by a processor, implement the method of any one of the above possible implementations of the first aspect.

A third aspect of the present application may include a memory system. The memory system comprises one or more memories, a memory controller coupled to the memories and configured to control the memories, and the memory controller comprising a decoding circuit. The decoding circuit is configured to implement the method of any of the above possible implementations of the first aspect.

A fourth aspect of the present application may include a memory controller. The memory controller comprises a bus and a decoding circuit coupled to the bus. The decoding circuit is configured to implement the method of any one of the above possible implementations of the first aspect.

A fifth aspect of the present application may include an electronic device, which comprises an interface circuit and the above memory system coupled to the interface circuit.

BRIEF DESCRIPTION OF THE DRAWINGS

In order to more clearly illustrate the technical solutions of the present disclosure, a brief description will be given below for the drawings required for use in some implementations of the present disclosure. The drawings described below are only drawings of some implementations of the present disclosure. Other drawings may be generated based on these drawings by those skilled in the art. In addition, the drawings in the figures presented here should be regarded as illustrative schematic diagrams—not limiting the actual size of the product, the actual flow of the method, or the actual timing of signals related to the implementations of the present application.

DETAILED DESCRIPTION

Figure 1:
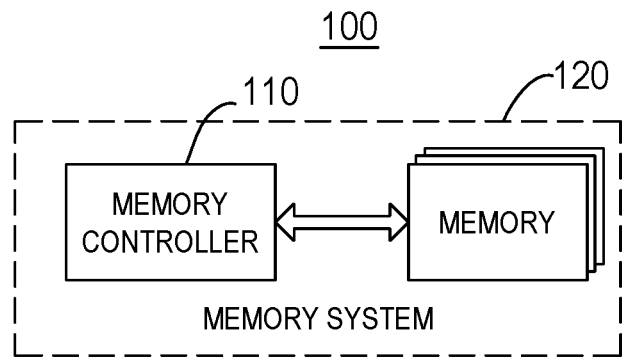
FIG. 1 is a schematic diagram of a memory system provided by implementations of the present application.

The technical solutions in some implementations of the present disclosure will be described below in conjunction with the accompanying drawings. The described implementations are only some of the implementations of the present disclosure, not all of them. Based on the implementations provided in the present disclosure, all other implementations developed by those skilled in the art belong to the protection scope of the present disclosure.

Throughout the specification and claims, the term "comprising" is interpreted in an open and inclusive sense, i.e., "including, but not limited to," unless otherwise indicated by the context. In the description of the specification, the terms "one implementation," "some implementations," "exemplary implementation." "exemplarily." or "some examples" are intended to indicate particular features, structures, materials, or characteristics related to the implementation or example are included in at least one implementation or example of the present disclosure. The schematic representations of the above terms do not necessarily refer to the same implementation or example. Furthermore, the particular features, structures, materials, or characteristics of the present application may be included in any suitable manner in any one or more implementations or examples.

Hereinafter, the terms "first" and "second" are used for descriptive purposes only and should not be understood as indicating or implying relative importance or implicitly specifying the quantity of indicated technical features. Thus, a feature defined as "first" or "second" may explicitly or implicitly include one or more of these features. In the description of the implementations of the present disclosure, unless otherwise specified, "a plurality of" means two or more.

When describing some implementations, expressions such as "coupled," "coupling." and "connected" and their derivatives may be used. For example, the term "connected" may be used when describing some implementations to indicate that two or more elements are in direct physical or electrical relationship to each other. As another example, the terms "coupled" or "coupling" may be used when describing some implementations to indicate that two or more elements are in direct physical or electrical contact. However, the terms "coupled" and "coupling" may also mean that two or more elements are not directly connected to each other but still cooperate or interact with each other. The implementations disclosed herein are not necessarily limited by the content herein.

The phrase "at least one of A. B. and C" has the same meaning as the phrase "at least one of A. B, or C," and both include the following combinations of A, B, C: A only. B only, C only, combinations of A and B, combinations of A and C, combinations of B and C. and combinations of A, B, and C.

The phrase "A and/or B" includes the following three combinations: A only, B only, and a combination of A and B.

The use of "suitable for" or "configured to" herein implies open and inclusive language that does not exclude devices that are suitable for or configured to perform additional tasks or steps.

In addition, the use of the phrase "based on" implies open and inclusive meanings since process, step, calculation, or other action "based on" one or more conditions or values may, in practice, be based on additional conditions or beyond values.

As shown in FIG. 1, a memory system 100 is installed in many electronic devices. The memory system 100 has one or more memories 120 and a memory controller 110.

In some implementations, the memory controller 110 is designed to operate in environments of low-duty cycles, such as secure digital (SD) memory cards, compact flash (CF) cards, Universal Serial Bus (USB) flash drives, or other media for use in electronic devices such as personal computers, digital cameras, mobile phones, and the like.

In some implementations, the memory controller 110 is designed to operate in environments of high-duty cycles in solid-state drive (SSD) or embedded MultiMediaCard (eMMC). SSD or eMMC may be used as data storage for mobile devices such as smartphones, tablets, laptops, etc., as well as enterprise storage arrays.

The memory controller 110 may be configured to control operations of one or more memories 120, such as read, erase, and program operations. The memory controller 110 may also be configured to manage various functions with respect to data stored or stored in the one or more memories 120, including, but not limited to, bad block management, garbage collection, logic to physical address translation, wear leveling, and the like. In some implementations, the memory controller 110 is further configured to process error correcting code (ECC) with respect to data read from or written to the one or more memories 120.

The memory controller 110 may also perform any other suitable function, such as formatting memory (as part of one or more memories 120). The memory controller 110 may communicate with an external device (e.g., the host) according to a particular communication protocol. For example, the memory controller 110 may communicate with the external device through at least one of various interface protocols such as USB protocol, MMC protocol. Peripheral Component Interconnect (PCI) protocol. PCI express (PCI-E) protocol. Advanced Technology Attachment (ATA) protocol, serial ATA protocol, parallel ATA protocol, Small Computer System Interface (SCSI) protocol, Enhanced Small Disk Interface (ESDI) protocol. Integrated Drive Electronics (IDE) protocol. FireWire protocol, and the like.

The memory controller 110 and one or more memories 120 may be integrated into various types of devices, for example, included in the same package (e.g., Universal Flash Storage (UFS) package or embedded MultiMediaCard (eMMC) package).

Figure 2:
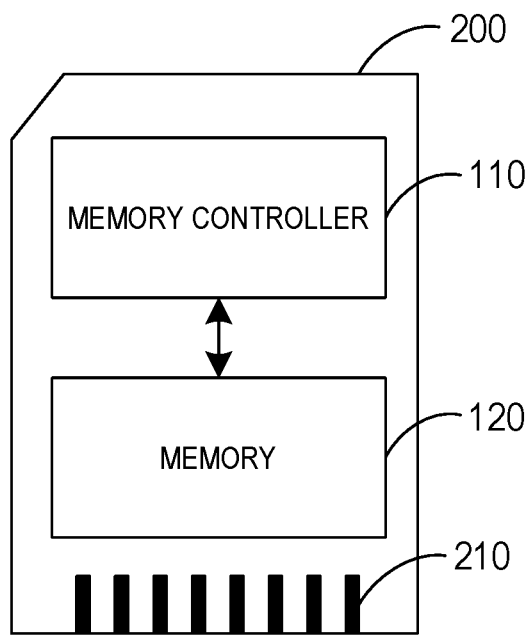
FIG. 2 is a schematic diagram of a memory card provided by implementations of the present application.

In an example, as shown in FIG. 2, the memory controller 110 and the single memory 120 may be integrated into a memory card 200. The memory card 200 may include a PC card (PCMCIA. Personal Computer Memory Card International Association), compact flash (CF) card, smart media (SM) card, memory stick, MultiMediaCard (MMC), SD card (SD, miniSD, microSD, SDHC), Universal Flash Storage (UFS), and the like. The memory card 200 may also include a memory card connector 210 that couples the memory card 200 to a host.

Figure 3:
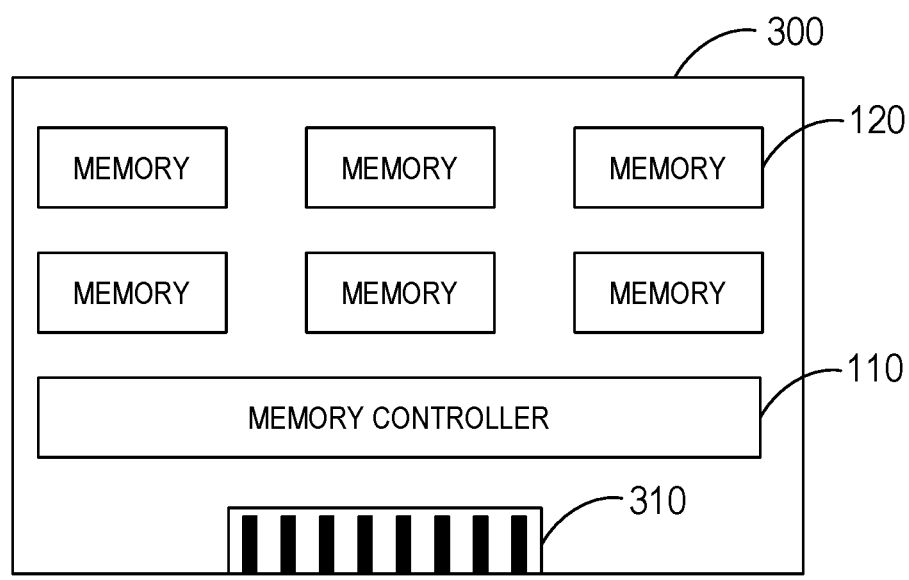
FIG. 3 is a schematic diagram of a solid-state hard disk provided by implementations of the present application.

In another example, as shown in FIG. 3, the memory controller 110 and a plurality of memories 120 may be integrated into a solid-state drive (SSD) 300. The SSD 300 may also include an SSD connector 310 that couples the SSD 300 to a host. In some implementations, the storage capacity and/or operating speed of the SSD 300 is greater than those of the memory card 200.

Figure 4:
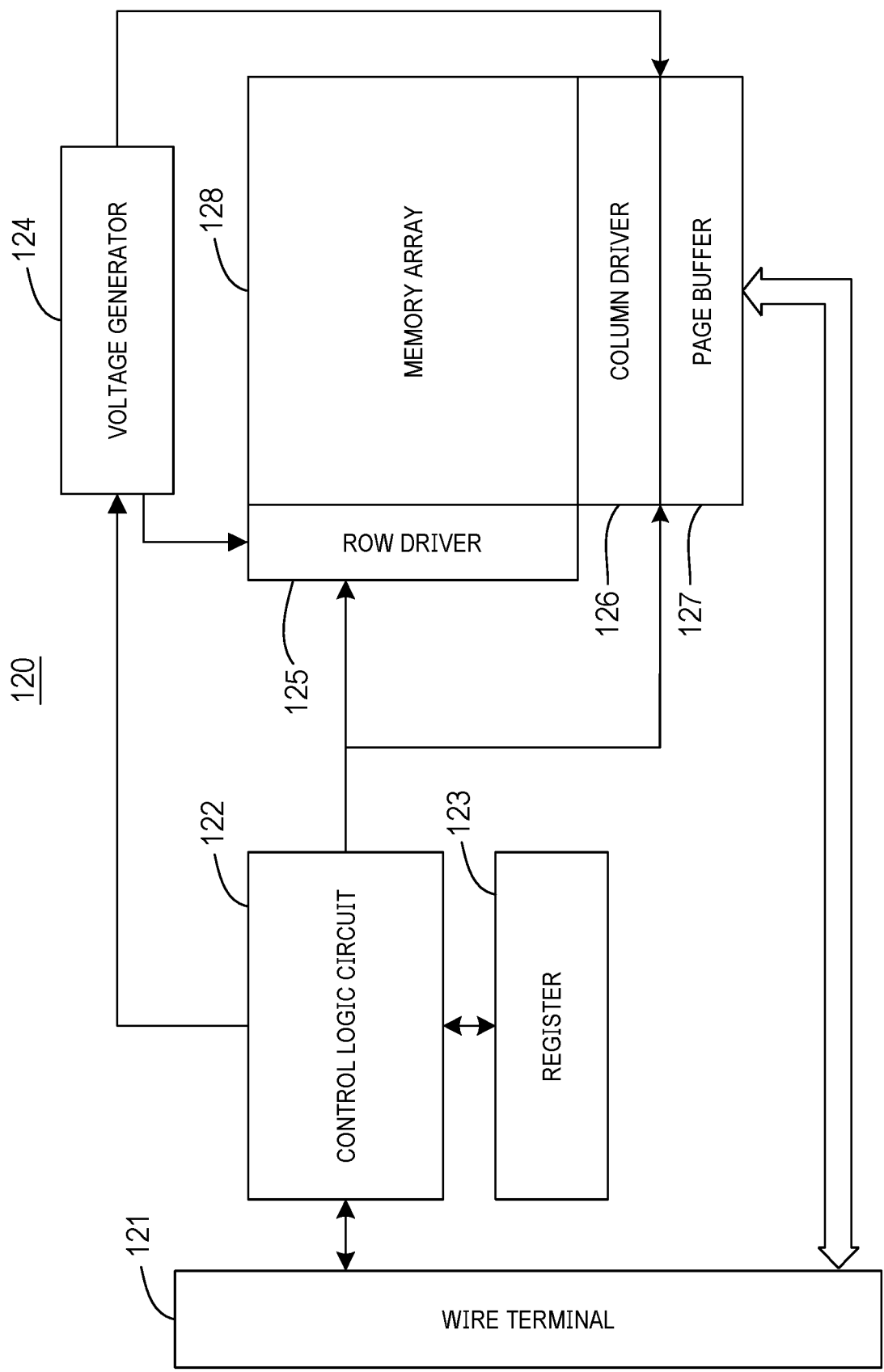
FIG. 4 is a schematic diagram of a memory provided by implementations of the present application.

As shown in FIG. 4, an instance of the one or more memories 120 includes a memory array 128 and a peripheral circuit. The peripheral circuit includes a wire terminal 121, a control logic circuit 122, a register 123, a voltage generator 124, a row driver 125, a column driver 126, and a page buffer 127. The wire terminal 121 is mainly used for receiving the read instruction and program instruction sent by the memory controller 110 and sending the read data to the memory controller 110, and so on. The control logic circuit 122 is mainly used for controlling the row driver 125, the column driver 126, and the page buffer 127 to perform operations such as reading, programming, erasing, and verifying according to the instructions sent by the memory controller 110. The register 123 may store control instructions sent by the memory controller 110.

Figure 5:
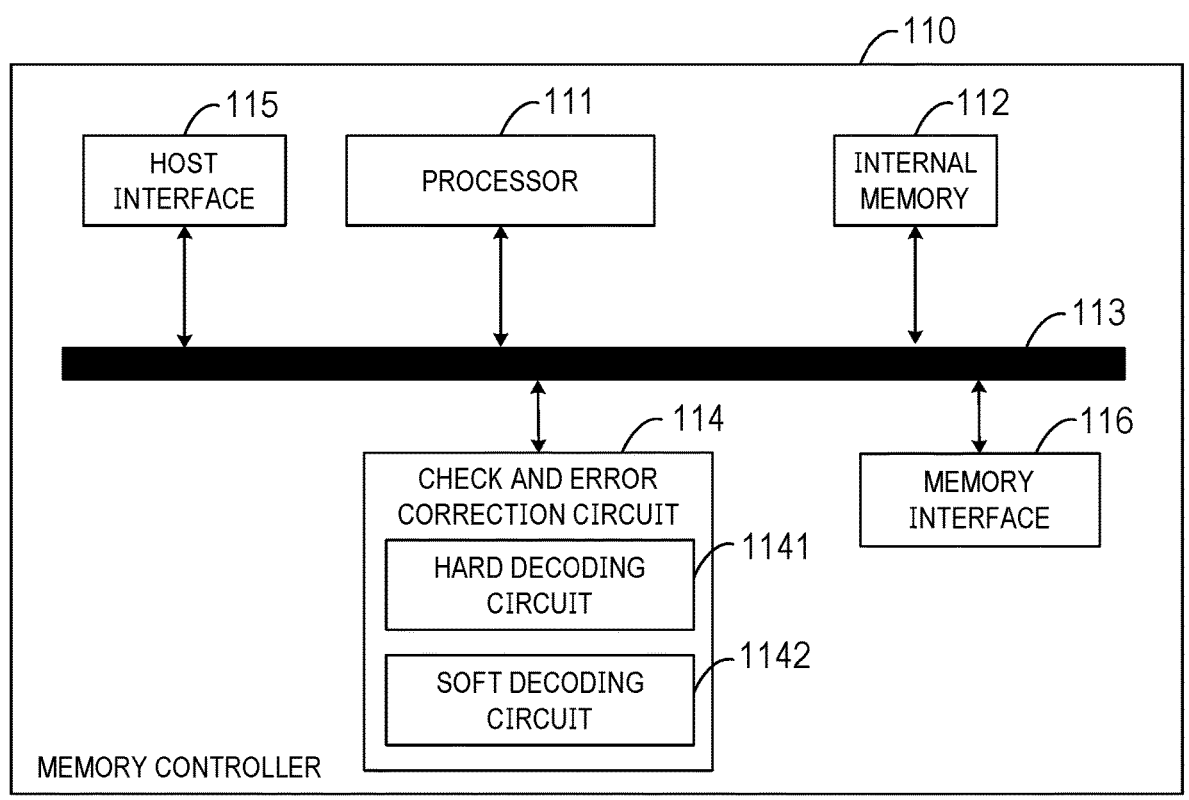
FIG. 5 is a schematic diagram of a memory controller provided by implementations of the present application.

In one example, as shown in FIG. 5, the memory controller 110 includes a host interface 115, a memory interface 116, a processor 111, an internal memory 112, and a check and error correction (ECC) circuit 114 coupled to a bus 113. The host interface 115 connects the host, and the memory interface 116 connects one or more memories. The processor 111 may receive a request instruction sent by the host through the bus 113 and send control instruction to the memory connected to the memory interface 116 in accordance with the request instruction to control the memory to perform a read/program operation. The internal memory 112 may include read-only memory (ROM) and random access memory (RAM). Microcontroller unit (MCU) may be selected as the processor 111. The ROM may store the fixed instructions that the processor needs to execute, such as the address of an initial log-likelihood ratio lookup table and the address of the fixed program that needs to run after the MCU starts. The RAM may store data for the MCU interacting with the host and memory. The check and error correction circuit 114 includes a soft decoding circuit 1142 and a hard decoding circuit 1141. The hard decoding circuit 1141 is configured to hard decode the hard-bit data read from the memory. The soft decoding circuit 1142 is configured to soft decode the soft-bit data read from the memory. The hard decoding may be performed using a low-density parity check (LDPC) code or the like. For example, the hard decoding may include parity-check operations for generating a check syndrome and bit flipping algorithms, min-sum algorithms, sum-product algorithms, and the like for determining error bits. The soft decoding may also be performed using the low-density parity check (LDPC) code or the like. For example, the soft decoding may further include operations on information such as log-likelihood ratio values. Further, the soft decoding may include decoding operations that are identical to or different from at least a portion of the hard decoding.

Figure 6:
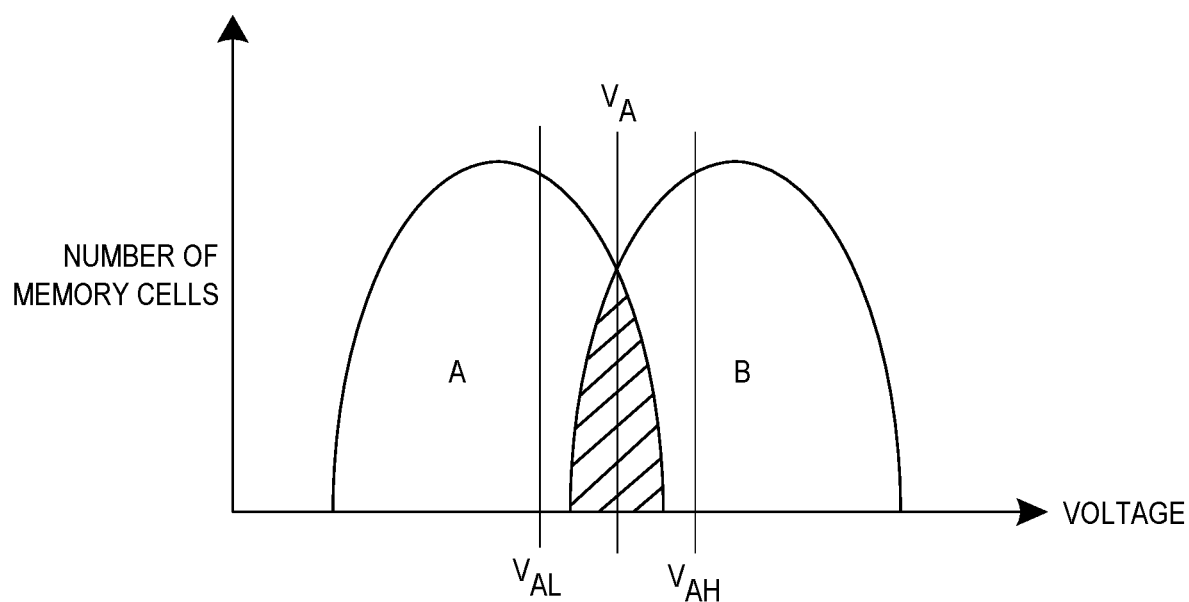
FIG. 6 is a graph depicting relationships between the distribution of memory cells relative to soft-bit data and hard-bit data provided by implementations of the present application.

Next, specific examples of hard-bit (HB) data and soft-bit (SB) data will be described with reference to FIG. 6. FIG. 6 is a graph showing the relationship between the distribution of the memory cells of the threshold voltages in the "B" program state and the "A" program state and the hard-bit data and the soft-bit data.

As shown in FIG. 6, due to the influence of read disturbance or data retention and the like, the width of the threshold voltage distributions of each program state sometimes extends so that a part of the lower end of the adjacent threshold voltage distributions overlaps each other (the slash-filled area in FIG. 6). In such a case, if the read operation is performed, the memory cells in the overlapping area at the lower end are more likely to become failure bits. More specifically, for example, when a read operation corresponding to the "B" program state is performed with the read voltage $V_A$, the memory cells of the "A" program state with a threshold voltage higher than the read voltage $V_A$, and the memory cells of the "B" program state with a threshold voltage lower than the read voltage $V_A$ become failure bits. If the number of resulting failure bits exceeds the number of bits that the ECC circuit can correct, it is difficult to read out the data correctly.

Therefore, in this implementation, two read voltages are set that are intervened by an overlapping region at the lower end of the threshold voltage distribution in a read operation of one program state. More specifically, two read voltages, $V_{AL}$ and $V_{AH}$, are set for the "B" program state. The read voltage $V_{AL}$ is smaller than the read voltage $V_A$. The read voltage $V_{AH}$ is higher than the read voltage $V_A$. The region where the "A" program state and the "B" program state overlap is located between the read voltage $V_{AL}$ and the read voltage $V_{AH}$. Further, the magnitude of the voltage difference between the read voltage $V_{AL}$ and the read voltage $V_A$ may be the same as or different from the magnitude of the voltage difference between the read voltage $V_A$ and the read voltage $V_{AH}$.

For example, in a read operation using the read voltage $V_{AL}$, the data of a memory cell whose threshold voltage is less than the read voltage $V_{AL}$ is "1", while the data of a memory cell whose threshold voltage is greater than the read voltage $V_{AL}$ is "0".

Moreover, in a read operation using the read voltage $V_{AH}$, the data of a memory cell whose threshold voltage is less than the read voltage $V_{AH}$ is "1", while the data of a memory cell whose threshold voltage is greater than the read voltage $V_{AH}$ is "0".

In this implementation, the read data based on the lower read voltage is defined as hard-bit data in two read voltages corresponding to one program state.

The soft-bit data is calculated based on logical operations of two read data (for example, XOR (exclusive OR) operation may be used). In the example of FIG. 6, the soft-bit data of the memory cell whose threshold voltage is less than the read voltage $V_{AL}$ is "0". The soft-bit data of a memory cell whose threshold voltage is greater than the read voltage $V_{AL}$ and less than the read voltage $V_{AH}$ is "1". The soft-bit data of the memory cell whose threshold voltage is greater than the read voltage $V_{AH}$ is "0". Further, the operation of the soft-bit data is not limited to the XOR operation. The operation of the soft-bit data may be set based on the definition of the soft-bit data. For example, in the case that the soft-bit data of a memory cell whose threshold voltage is greater than the read voltage $V_{AL}$ and less than the read voltage $V_{AH}$ is defined as "0", XNOR operation may also be used for the calculation of the soft-bit data.

The soft-bit data thus indicates whether the threshold voltage is near the interface of two adjacent threshold voltage distributions. The information on whether the threshold voltage is located at a portion of the lower end of the threshold voltage distribution in the program state of the object can be obtained by referring to the hard-bit data and the soft-bit data.

Further, during soft decoding, if soft decoding fails, the common solutions mainly include the following three types: 1) performing more read offsets based on the reference read voltage to get more soft-bit data for decoding; 2) offsetting the reference read voltage and obtaining the soft-bit data based on the offset reference level for soft decoding; and 3) setting up lookup tables in multiple scenarios, such that when soft decoding with one lookup table fails, soft decoding is performed with other LLR lookup tables.

However, many decoding flows may be added by adjusting the soft decoding strategy with the above-disclosed techniques; thus, delay of soft decoding is increased and efficiency of soft decoding is decreased.

Figure 7:
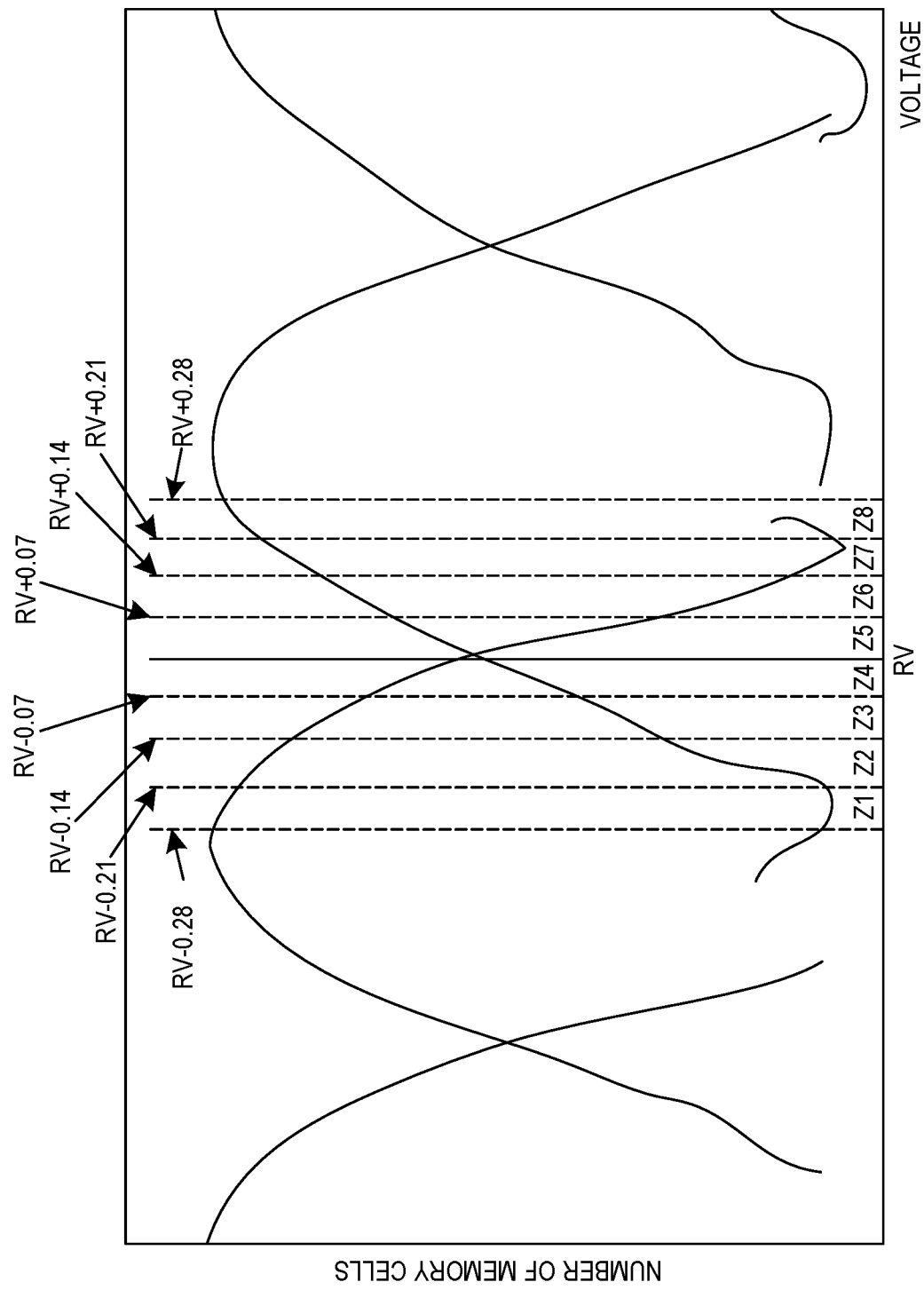
FIG. 7 is a graph of confidence interval distribution when reading soft-bit data provided by implementations of the present application.

As shown in FIG. 7, when soft-bit data is read from an overlapping region of two adjacent program states in memory cells, a plurality of positive and negative voltage offsetting to the reference read voltage RV may be performed to obtain multiple soft-bit data. Taking eight offset voltages, for example ±0.07V, ±0.14V, ±0.21V, and ±0.28V, the overlapping region may be divided into eight confidence intervals (Z1-Z8) when reading soft-bit data by eight offset voltages. The variations of LLR values in the above eight confidence intervals when the soft-bit data is read by four offset voltages ±0.07V and ±0.14V are shown in Table 1. When the LLR value is positive, the larger the value, the greater the probability that the data is 0. When the LLR value is negative, the smaller the value, the greater the probability that the data is 1.

TABLE 1

| | | | | | | | | |
|---|---|---|---|---|---|---|---|---|
| RV − 0.14 | 63 | 63 | 57 | 39 | 23 | 10 | −8 | −59 |
| RV − 0.07 | 63 | 57 | 39 | 23 | 10 | −8 | −26 | −63 |
| RV | 63 | 39 | 23 | 10 | −8 | −26 | −49 | −63 |
| RV + 0.07 | 63 | 23 | 10 | −8 | −26 | −49 | −53 | −63 |
| RV + 0.14 | 54 | 10 | −8 | −26 | −49 | −53 | −63 | −63 |

Figure 8:
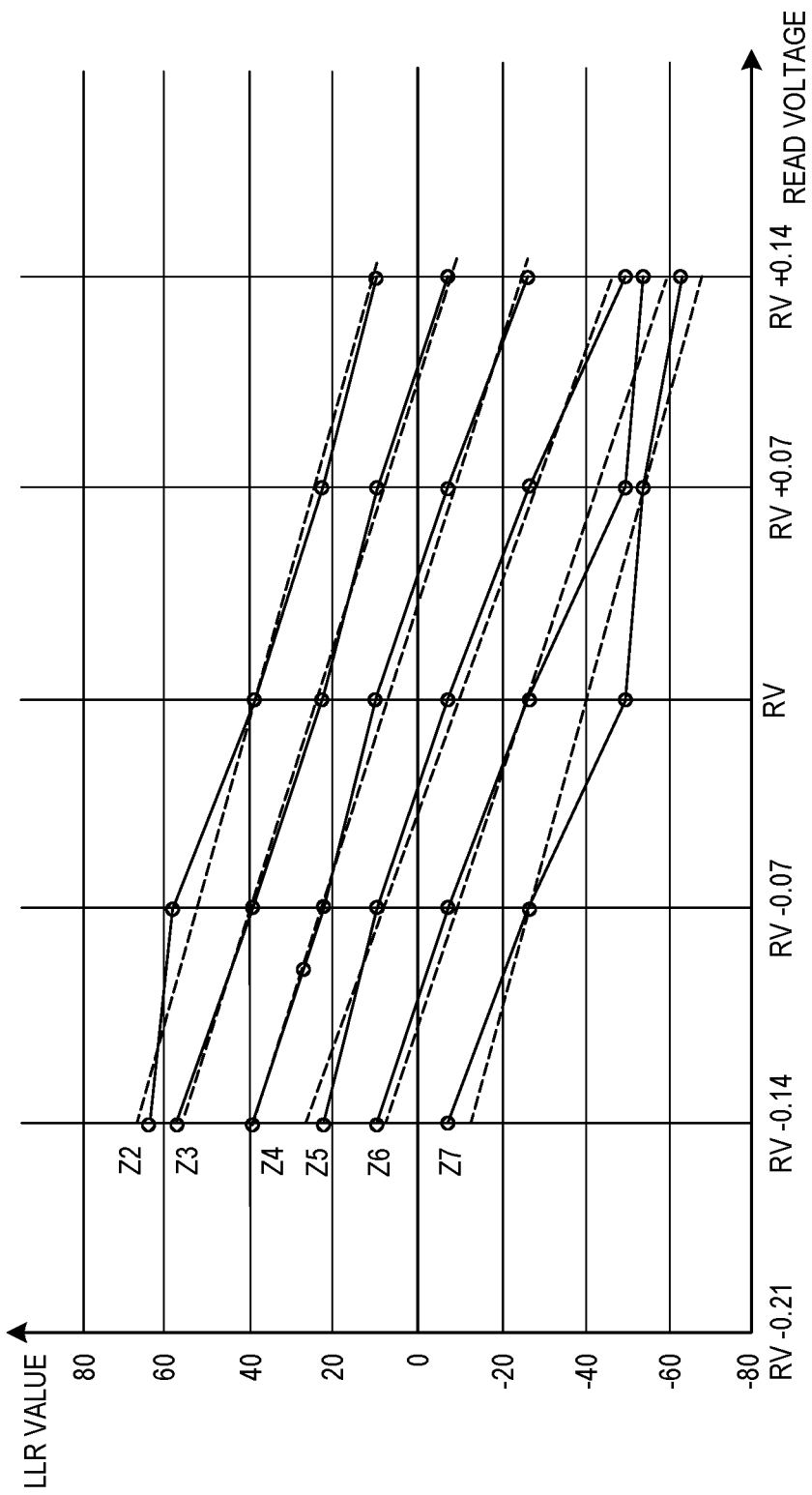
FIG. 8 is a graph of variation trends of LLR values of confidence intervals provided by implementations of the present application.

It can be seen from Table 1 that the LLR values of confidence intervals Z2-Z7 vary when the soft-bit data is read with four offset voltages, ±0.07V and ±0.14V. In order to observe the variation trend of the LLR value more intuitively, the variation trend chart of the LLR value of each confidence interval can be drawn based on Table 1. The variation trend chart of the LLR value is shown in FIG. 8. It can be seen from FIG. 8 that there is a very good linear relationship between the LLR values of the confidence interval Z2-Z7 and the positive and negative offset voltages used when the soft-bit data is read. Therefore, it is feasible to shift the LLR value according to this linear relationship so as to perform soft decoding.

Figure 9:
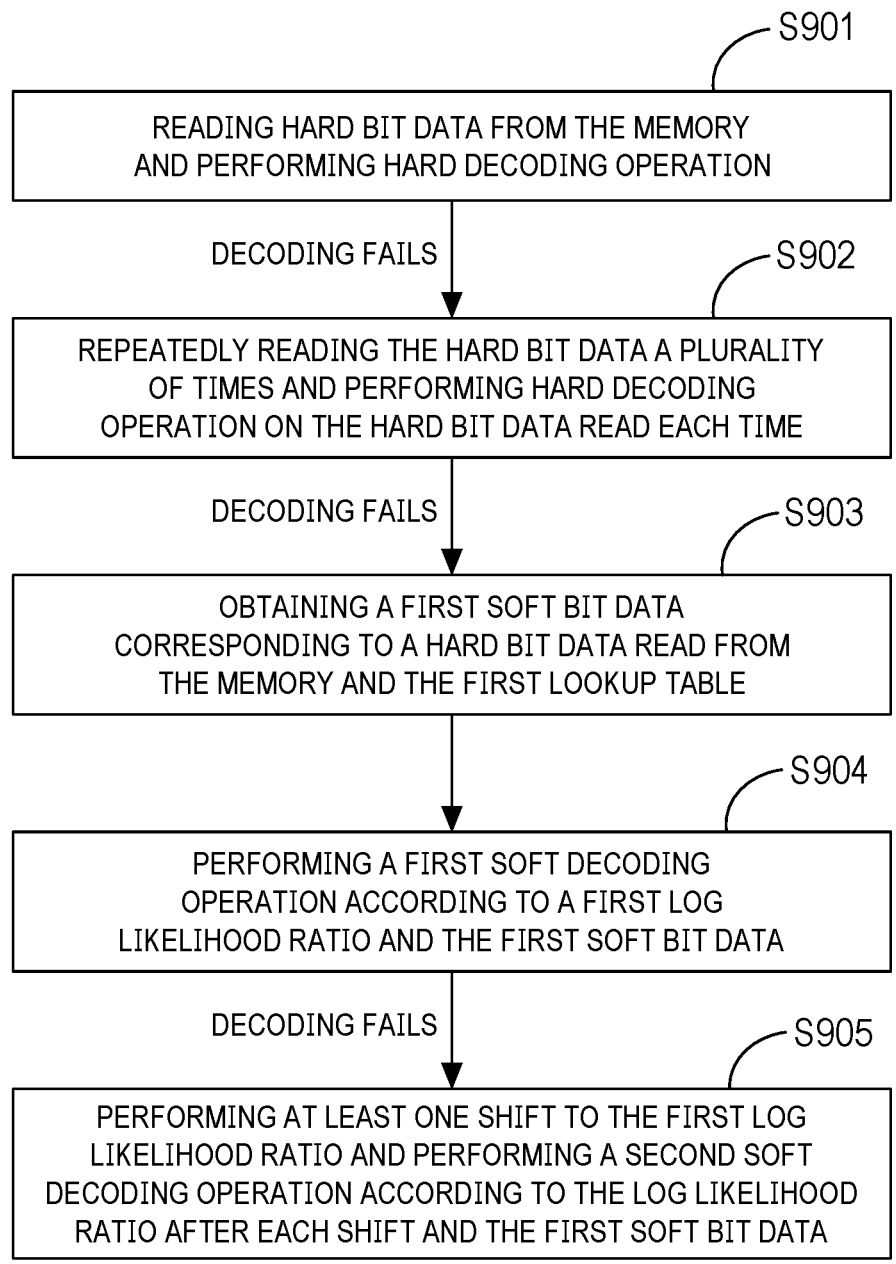
FIG. 9 is a flow diagram of a method for controlling a memory system provided by implementations of the present application.

Accordingly, in order to solve the above-identified problems, as shown in FIG. 9, a method for controlling a memory system is provided by the implementations of this application, which can be executed by a memory controller. The specific implementation flow is as follows.

S901. Reading hard-bit data from memory and performing hard decoding operations.

As an example, the memory controller may send control instructions to the control logic circuit in the memory to instruct the control logic circuit to read hard-bit data at the corresponding program state from the memory cells according to a first reference read voltage. The above first reference read voltage may be the best read voltage for the memory (e.g., NAND memory) in certain scenarios. The best read voltage may be obtained by testing on the memory device in a setting scenario. The setting scenario can be set according to the actual use environment of the memory. For example, the setting scenarios may include environmental factors in which the memory is located and parameters of the memory itself, such as temperature and humidity of the environment, the supply voltage of the memory, the times of erasure, and the like. In the above implementation, if the decoded data are obtained by successfully performing hard decoding, the decoded data is outputted and the decoding is stopped; otherwise, the process proceeds to S902.

S902. Repeatedly reading the hard-bit data multiple times and performing hard decoding operations on the hard-bit data read each time.

If the first hard decoding fails during the above-disclosed process, the memory controller may continue to send control instructions to the control logic circuit in the memory to repeatedly read the hard-bit data at the corresponding program state in the memory cell. The control logic circuit, when reading the hard-bit data, may use the reference read voltage in the same scenario for repeated reading or may use the reference read voltage in different scenarios for repeated reading, which is not limited to the implementations discussed in this application.

In the above implementation, if the decoded data are obtained by successfully performing hard decoding, the decoded data is outputted and the decoding is stopped; otherwise, the process proceeds to S903.

S903. Obtaining a first soft-bit data corresponding to the hard-bit data read from the memory and a first lookup table.

The first lookup table includes a first log-likelihood ratio determined based on the first reference read voltage of the memory. The operating user may use the best read voltage in certain scenarios as the first reference read voltage and then obtain the first log-likelihood ratio after test(s) and calculation. The first soft-bit data may be read by referencing a read voltage after performing one or more positive and negative voltage offsetting to the first reference read voltage. The first reference read voltage and each offset voltage value may be set according to the actual scene requirements, which is not limited in the implementations of the present application.

As an example, after a hard decoding operation fails, the memory controller may send a control instruction to the logic control circuit within the memory to instruct the control logic circuit to read the first soft-bit data in the memory cell.

In the above implementation, the first lookup table may be stored in an internal memory of the memory controller or in a memory coupled to the memory controller. When the first lookup table is stored in the internal memory of the memory controller, ROM may be used for storage. The memory controller may read the first lookup table from ROM after the hard decoding operation fails. When the first lookup table is stored in the memory coupled to the memory controller, the address information of the first lookup table may be stored in ROM so that the first lookup table may be read from the corresponding address of the memory when the soft decoding operation is performed.

S904. Performing a first soft decoding operation according to the first log-likelihood ratio and the first soft-bit data.

As an example, the first soft-bit data may be soft-decoded by a soft decoding circuit (which may include an LDPC decoder) according to a first log-likelihood ratio after the first soft-bit data is obtained by the memory controller. If decoding is successful, the decoded data is output. Otherwise, the process proceeds to S905. The first soft-bit data may include the soft-bit data read after performing one or more positive and negative offsetting to the first reference read voltage. Correspondingly, the first soft decoding operation includes at least one soft decoding. i.e., each soft-bit data corresponds to one soft decoding.

S905. Performing at least one shift to the first log-likelihood ratio and performing a second soft decoding operation according to the log-likelihood ratio after each shift and the first soft-bit data when the first soft decoding operation is determined as having failed to decode.

In one possible implementation, if the first soft decoding fails to decode, the soft decoding circuit in the memory controller may perform at least one shift to the first log-likelihood ratio and perform the second soft decoding operation according to the log-likelihood ratio after each shift and the first soft-bit data. The second soft decoding operation includes at least one soft decoding; that is, every time the first log-likelihood ratio is shifted, the soft decoding is performed according to the log-likelihood ratio after the shift and the first soft-bit data.

Figure 10:
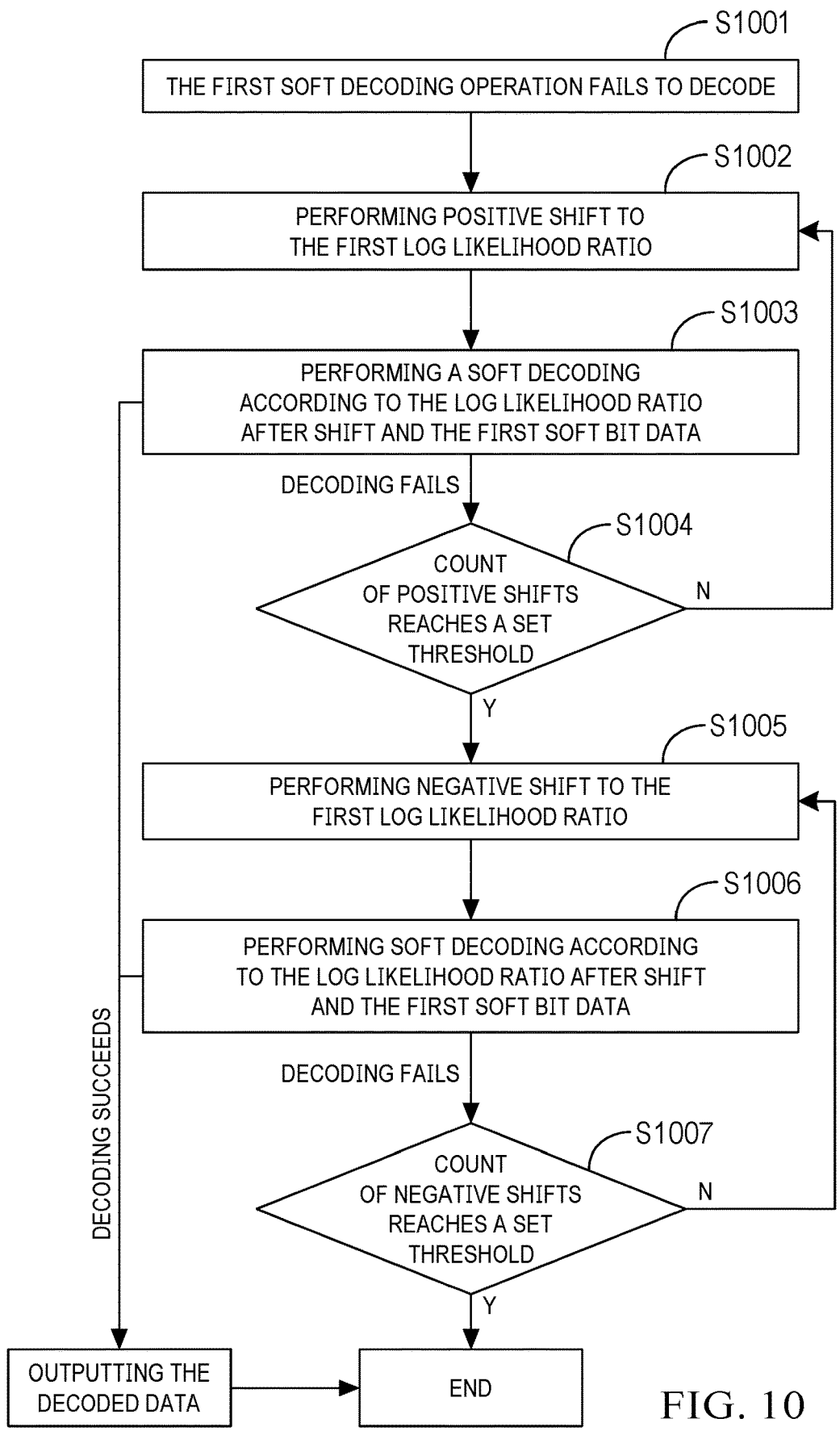
FIG. 10 is a flow diagram of the shifting of LLR values provided by implementations of the present application.

As an example, at least one positive shift to the first log-likelihood ratio may be performed first, and soft decoding may be performed according to the log-likelihood ratio after each shift and the first soft-bit data. If the decoding still fails, at least one negative shift to the first log-likelihood ratio may then be performed, and soft decoding may be performed according to the log-likelihood ratio after each shift and the first soft-bit data. The specific implementation is shown in FIG. 10.

S1001. Determining that a first soft decoding operation fails to decode.

If no correct data is obtained by the soft decoding circuit based on the first log-likelihood ratio and the first soft-bit data, the first soft decoding operation fails to decode.

S1002. Performing a positive shift to the first log-likelihood ratio.

In one example, as shown in Table 2, assuming that the overlapping region of two adjacent program states in a certain memory cell is divided into a plurality of confidence intervals (Z1, Z2, Z3, . . . ), the initial LLR value corresponding to each confidence interval is (a, b, c, . . . ) sequentially, the value of each positive shift may be the same (i.e., the value of each shift is fixed) when a positive shift to the first log-likelihood ratio is performed. In Table 2, m represents the value of the shift. The value can be set according to the actual requirements and is not limited to the implementations of the present application.

TABLE 2

| confidence intervals | Z1 | Z2 | Z3 | ... |
|---|---|---|---|---|
| initial LLR value | a | b | c | ... |
| the first shift | a + m | b + m | c + m | ... |
| the second shift | a + 2m | b + 2m | c + 2m | ... |
| ... | ... | ... | ... | ... |

In another example, as shown in Table 3, the value of each positive shift may be different (i.e., the value of each shift is a non-fixed value) when the positive shift to the first log-likelihood ratio is performed. In Table 3, n and n represent two values of different magnitudes. These two values may be set according to actual requirements and are not limited to the implementations of the present application.

TABLE 3

| confidence intervals | Z1 | Z2 | Z3 | ... |
|---|---|---|---|---|
| initial LLR value | a | b | c | ... |
| the first shift | a + m | b + m | c + m | ... |
| the second shift | a + m + n | b + m + n | c + m + n | ... |
| ... | ... | ... | ... | ... |

S1003. Performing the soft decoding according to the log-likelihood ratio after shifting and the first soft-bit data.

The soft decoding may be performed with the first soft-bit data every time the log-likelihood ratio is shifted. The decoded data is outputted if decoding is successful. Otherwise, the process proceeds to S1004.

S1004. Determining whether a count of positive shifts to the first log-likelihood ratio reaches a set threshold.

If the count of the positive shifts to the first log-likelihood ratio reaches the set threshold, S1005 to S1007 are performed. If the count of the positive shifts to the first log-likelihood ratio does not reach the set threshold, the performance of S1002 to S1003 continues.

S1005. Performing a negative shift to the first log-likelihood ratio.

In one example, as shown in Table 4, the value of each positive shift may be the same (i.e., the value of each shift is a fixed value) when the positive shift to the first log-likelihood ratio is performed. In Table 4, m represents the value of each positive shift. The value may be set according to the actual requirements and is not limited to the implementations of the present application.

TABLE 4

| confidence intervals | Z1 | Z2 | Z3 | ... |
|---|---|---|---|---|
| initial LLR value | a | b | c | ... |
| the first shift | a − m | b − m | c − m | ... |
| the second shift | a − 2m | b − 2m | c − 2m | ... |
| ... | ... | ... | ... | ... |

In another example, as shown in Table 5, the value of each positive shift may be different (i.e., the value of each shift is a non-fixed value) when a negative shift to the first log-likelihood ratio is performed. In Table 5, m and n represent two values of different magnitudes. These two values may be set according to actual requirements and are not limited to the implementations of the present application.

TABLE 5

| confidence intervals | Z1 | Z2 | Z3 | ... |
|---|---|---|---|---|
| initial LLR value | a | b | c | ... |
| the first shift | a − m | b − m | c − m | ... |
| the second shift | a − m − n | b − m − n | c − m − n | ... |
| ... | ... | ... | ... | ... |

S1006. Performing soft decoding according to the log-likelihood ratio after shift and the first soft-bit data.

The soft decoding may be performed with the first soft-bit data every time the log-likelihood ratio is shifted. The decoded data is outputted if decoding is successful. Otherwise, the process proceeds to S1007.

S1007. Determining whether a count of the negative shifts to the first log-likelihood ratio reaches a set threshold.

If the count of the negative shifts to the first log-likelihood ratio reaches a set threshold, the second soft decoding operation is stopped. If the count of the negative shifts to the first log-likelihood ratio does not reach the set threshold, the performance of S1005 to S1006 continues.

Figure 11:
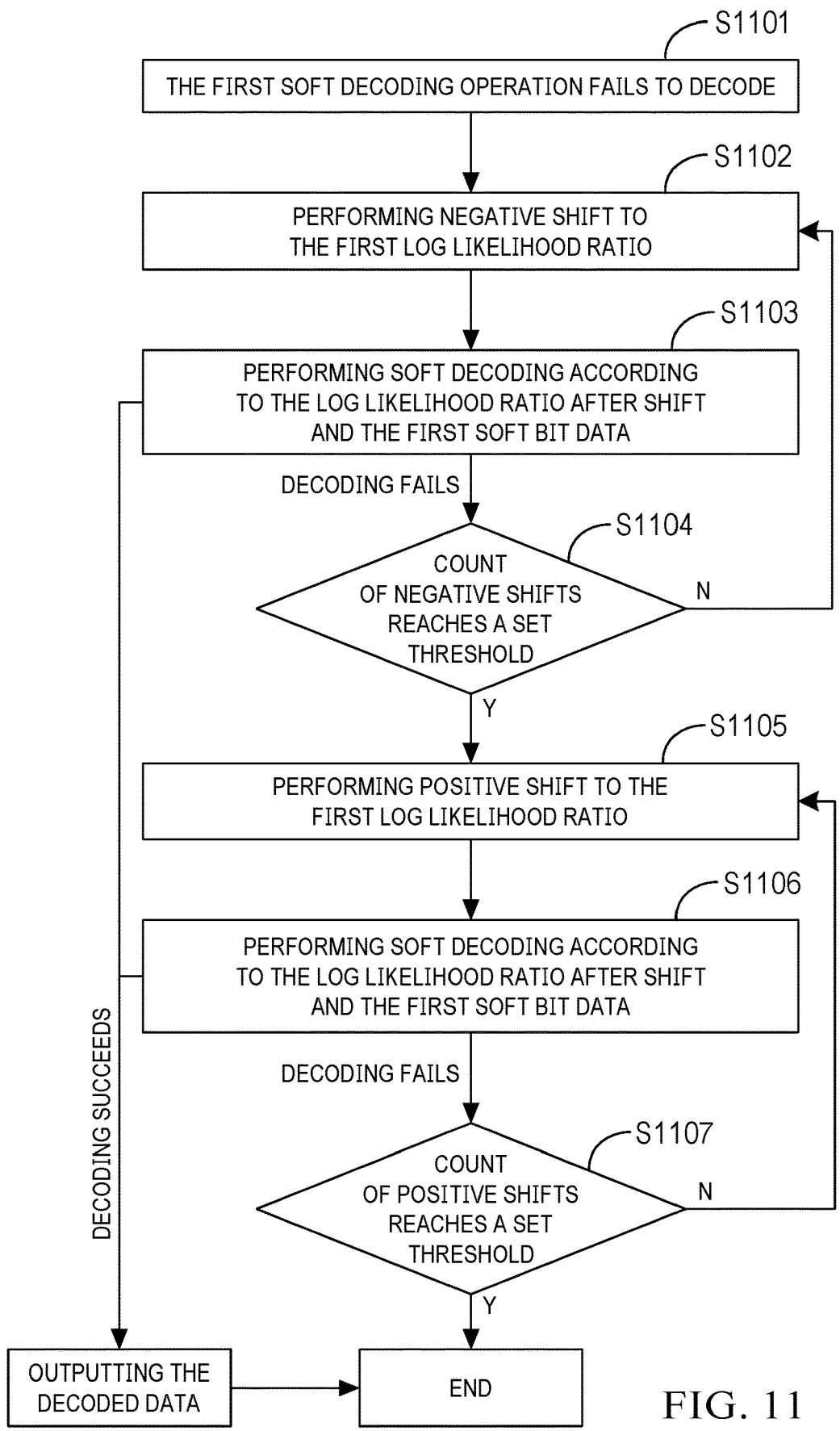
FIG. 11 is a flow diagram of the shifting of LLR values provided by implementations of the present application.

In another possible implementation, it is possible that at least one negative shift to the first log-likelihood ratio is performed first, and soft decoding is performed according to the log-likelihood ratio after each shift and the first soft-bit data. If decoding still fails, at least one positive shift to the first log-likelihood ratio may then be performed, and soft decoding is performed according to the log-likelihood ratio after each shift and the first soft-bit data. This specific process is shown in FIG. 11.

S1101. Determining that a first soft decoding operation fails to decode.

If no correct data is obtained by the soft decoding according to the first log-likelihood ratio and the first soft-bit data, the first soft decoding operation fails to decode.

S1102. Performing a negative shift to the first log-likelihood ratio.

The negative shift to the first log-likelihood ratio may be performed by way of referring to Table 4 or Table 5.

S1103. Performing soft decoding according to the log-likelihood ratio after shift and the first soft-bit data.

The soft decoding may be performed with the first soft-bit data every time the log-likelihood ratio is shifted. The decoded data is outputted if decoding is successful. Otherwise, the process proceeds to S1104.

S1104. Determining whether a count of negative shifts to the first log-likelihood ratio reaches a set threshold.

If the count of negative shifts to the first log-likelihood ratio reaches the set threshold, S1105 to S1107 are performed. If the count of negative shifts to the first log-likelihood ratio does not reach the set threshold value, the performance of S1102 to S1103 continues.

S1105. Performing a positive shift to the first log-likelihood ratio.

The positive shift to the first log-likelihood ratio may be performed by way of referring to Table 2 or Table 3—not rehashed here.

S1106. Performing soft decoding according to the log-likelihood ratio after shift and the first soft-bit data.

The soft decoding may be performed with the first soft-bit data every time the log-likelihood ratio is shifted. The decoded data is outputted if decoding is successful. Otherwise, the process proceeds to S1107.

S1107. Determining whether a count of positive shifts to the first log-likelihood ratio reaches a set threshold.

If the count of the positive shift to the first log-likelihood ratio reaches the set threshold, the second soft decoding operation is stopped. If the count of positive shifts to the first log-likelihood ratio does not reach the set threshold, the performance of S1105 to S1106 continues.

In yet another possible implementation, the first log-likelihood ratio may be cross-shifted, and soft decoding is performed according to the log-likelihood ratio after each shift and the first soft-bit data. The cross-shifting means that the positive shift and the negative shift are cross-performed, but the counts of positive shifts or negative shifts after each crossing are not limited.

In one example, at least one positive shift to the first log-likelihood ratio may be performed first, and soft decoding is performed according to the log-likelihood ratio after each shift and the first soft-bit data. Next, at least one negative shift to the first log-likelihood ratio may be performed, and soft decoding is performed according to the log-likelihood ratio after each shift and the first soft-bit data. Then, at least one positive shift to the first log-likelihood ratio may be performed, and soft decoding is performed according to the log-likelihood ratio after each shift and the first soft-bit data, and so on until the decoding is successful or the count of shifts to the first log-likelihood ratio reaches a set maximum value. The value of each shift may be the same or different.

As an example, as shown in Table 6, assuming that the overlapping region of two adjacent program states in a certain memory cell is divided into a plurality of confidence intervals (Z1, Z2, Z3, . . . ), and the initial LLR value corresponding to each confidence interval is (a, b, c, . . . ) sequentially. For the first shift, a positive shift to the first log-likelihood ratio may be performed first (i.e., adding m). For the second shift, a negative shift to the first log-likelihood ratio may be performed for the first time (i.e., subtracting m). For the third shift, a positive shift to the first log-likelihood ratio may be performed for the second time (i.e., adding m+n). For the fourth shift, a negative shift to the first log-likelihood ratio may be performed for the second time (i.e., subtracting 2m). The values of in and n may be set according to actual requirements and are not limited in the implementations of the present application.

TABLE 6

| confidence intervals | Z1 | Z2 | Z3 | ... |
|---|---|---|---|---|
| initial LLR value | a | b | c | ... |
| the first shift | a + m | b + m | c + m | ... |
| the second shift | a − m | b − m | c − m | ... |
| the third shift | a + m + n | b + m + n | c + m + n | ... |
| the fourth shift | a − 2m | a − 2m | a − 2m | ... |
| ... | ... | ... | ... | ... |

In the above implementation, the values of each positive shift or negative shift during the cross-shifting may also be set according to actual requirements and are not limited to those in Table 6.

Figure 12:
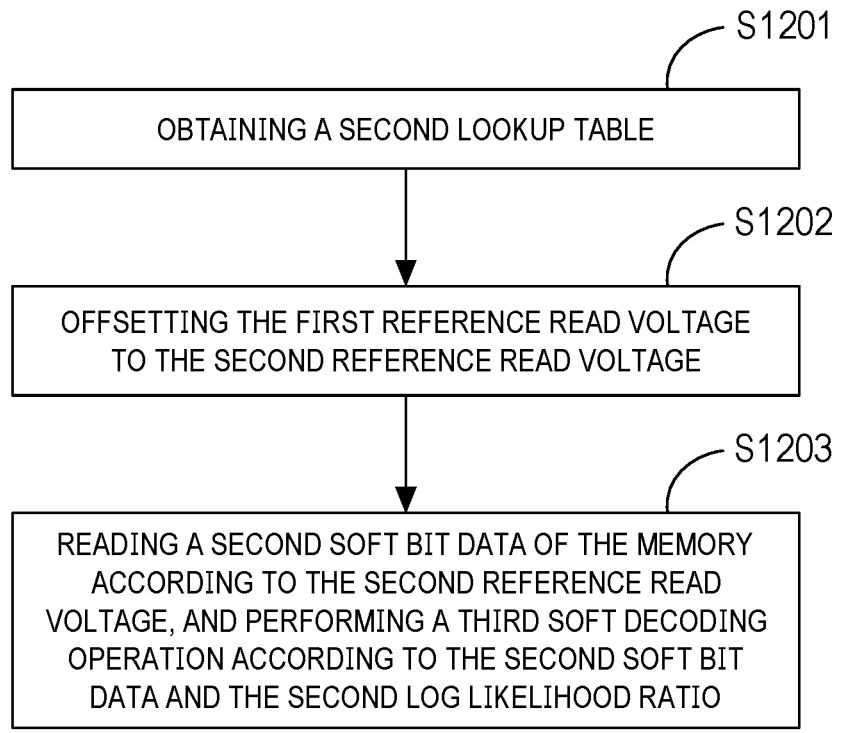
FIG. 12 is a flow diagram after the failure of a second soft decoding provided by implementations of the present application.

In one possible implementation, as shown in FIG. 12, the soft decoding circuit may change to use the second lookup table to continue soft decoding of the first soft-bit data after the count of shifts to the first log-likelihood ratio reaches a preset value and then the second soft decoding operation stops, the details are described as follows.

S1201. Obtaining a second lookup table.

The second lookup table includes a second log-likelihood ratio determined based on the second reference read voltage, and the scenarios corresponding to the first lookup table and the second lookup table are different.

In particular, the reference read voltage in some scenarios may be offset; therefore, the operating user may offset the reference read voltage in some scenarios to get the second reference read voltage, which may be tested and calculated to obtain the second log-likelihood ratio that may be successfully decoded. The second lookup table may also be stored in an internal memory of the memory controller or in a memory coupled to the memory controller.

S1202. Offsetting the first reference read voltage to the second reference read voltage.

The offsetting of the read voltage may be set according to the actual requirements, which are not limited to the implementations of the present application.

S1203. Reading a second soft-bit data of the memory according to the second reference read voltage and performing a third soft decoding operation according to the second soft-bit data and the second log-likelihood ratio.

The third soft decoding operation may be performed with reference to the second soft decoding operation.

In the above-disclosed way, to improve the efficiency of soft decoding, the reference read voltage may be offset first, then the LLR value may be shifted on the basis of the second lookup table.

Figure 13:
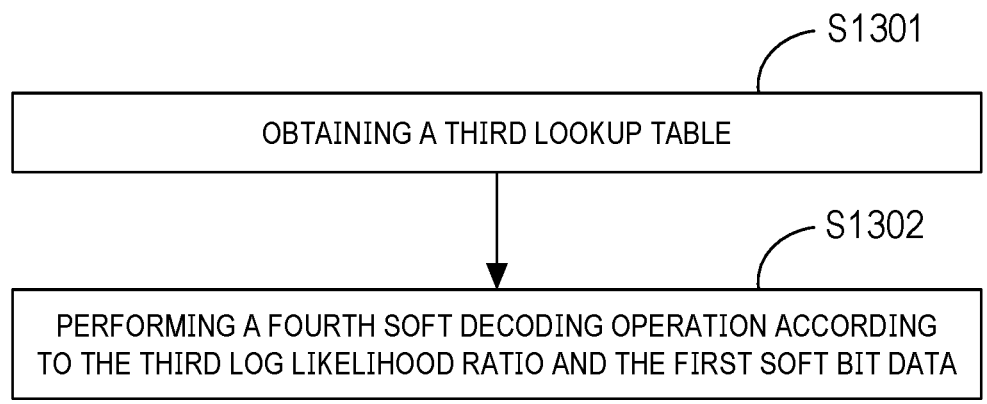
FIG. 13 is a flow diagram after the failure of a second soft decoding provided by implementations of the present application.

In one possible implementation, as shown in FIG. 13, the soft decoding circuit may also change to use a third lookup table to continue soft decoding the first soft-bit data after the count of shifts to the first log-likelihood ratio reaches a preset value and then the second soft decoding operation stops, the details are described as follows.

S1301. Obtaining a third lookup table.

The third lookup table includes a third log-likelihood ratio determined based on a third reference read voltage. The scenarios corresponding to the third lookup table and the first lookup table are different.

S1302. Performing a fourth soft decoding operation based on the third log-likelihood ratio and the first soft-bit data.

When the third lookup table is obtained, soft decoding may be performed directly according to the third lookup table to improve the efficiency of soft decoding by changing the lookup table for soft decoding.

In the above implementation, the soft decoding corresponding to FIGS. 10 and 11 may be selectively performed after the soft decoding fails by shifting the LLR value based on the first lookup table, which is not limited to the implementations of the present application.

In one possible implementation, steps for shifting the log-likelihood ratio and soft decoding in the various possible implementations described above may be realized by the soft decoding circuit.

Figure 14:
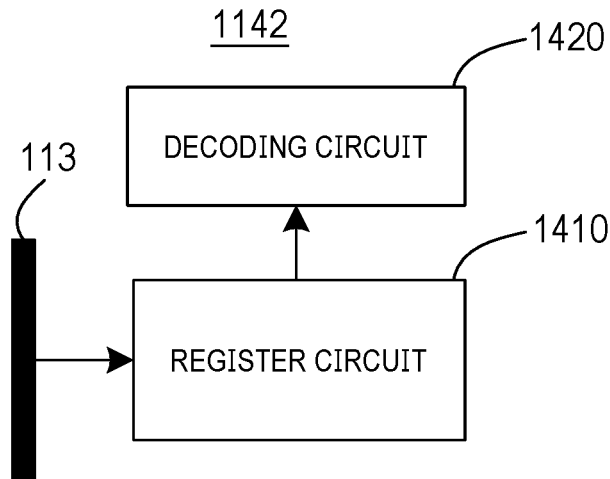
FIG. 14 is a schematic diagram of a soft decoding circuit provided by implementations of the present application.
Figure 15:
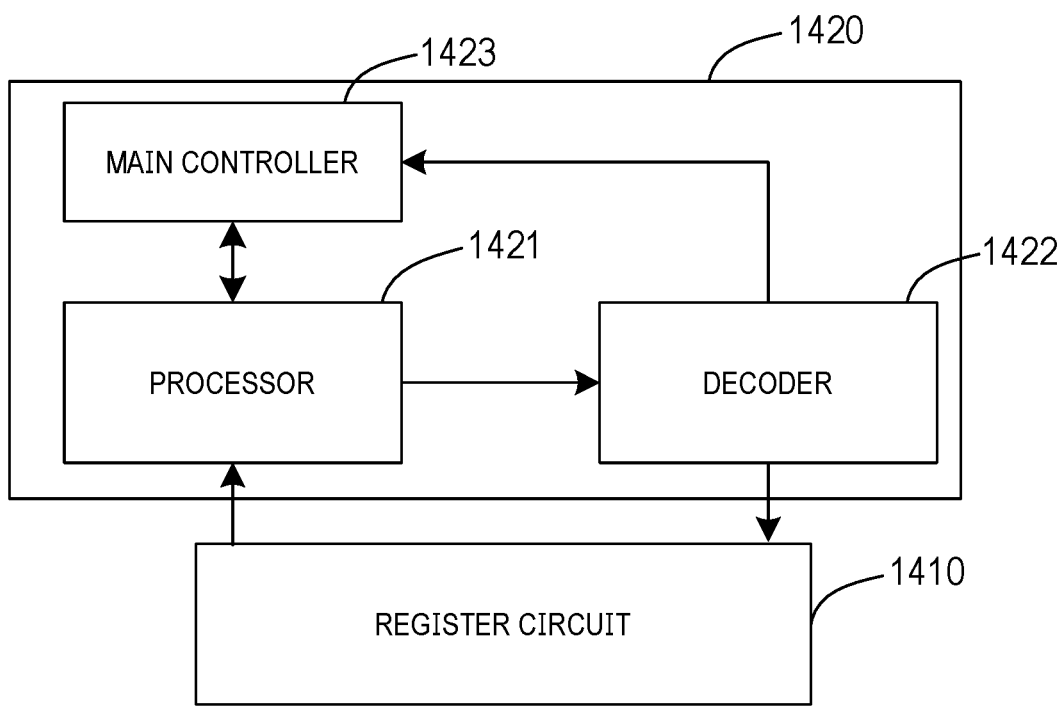
FIG. 15 is a schematic diagram of a decoding circuit provided by implementations of the present application.

As an example, as shown in FIG. 14, the soft decoding circuit 1142 may include a register circuit 1410 coupled to bus 113 and a decoding circuit 1420 coupled to the register circuit 1410. As shown in FIG. 15, the decoding circuit 1420 may include a processor 1421 coupled to the register circuit 1410, a decoder 1422 coupled to the processor 1421, and a main controller 1423 coupled to the decoder 1422 and the processor 1421. The register circuit 1410 may store a lookup table read from the memory and soft-bit data read from the memory. The processor 1421 may send LLR values in the lookup table and soft-bit data to decoder 1422 for soft decoding. If the decoding is successful, the decoder 1422 sends the decoded data to the register circuit 1410 for buffering. If the decoding fails, the decoder 1422 sends a flag signal to the main controller 1423. Upon receiving the flag signal, the main controller 1423 may send an indication signal to the processor 1421. The indication signal may instruct processor 1421 to shift the LLR values in the lookup table and then transmit the LLR values to decoder 1422 for soft decoding. An LDPC decoder may be selected as the decoder 1422. The main controller 1423 and processor 1421 described above may include, but are not limited to, a central processing unit (CPU), a network processing unit (NPU), a graphics processing unit (GPU), a digital signal processor (DSP), or a general-purpose processor, or the like.

The main controller 1423 and the processor 1421 may also be the same device in the above implementations, and the implementations of the present application do not specifically limit this. Moreover, the above-discussed soft decoding circuit 1142 may be provided on a circuit board to be sold or used as a separate chip or may be sold or used as a part of a memory controller.

In one possible implementation, a computer-readable storage medium is also provided by the implementations of this application. The computer-readable storage medium stores computer program instructions, which, when executed by the processor, implement the steps corresponding to the method of any of the above possible implementations.

In some implementations, the storage medium described above may be ferromagnetic random-access memory (FRAM), read-only memory (ROM), programmable read-only memory (PROM), erasable programmable read-only memory (EPROM), electrically erasable programmable read-only memory, flash memory, magnetic surface memory, optical disc, compact disc read memory (CD-ROM). UFS, CF card, memory stick and so on.

Figure 16:
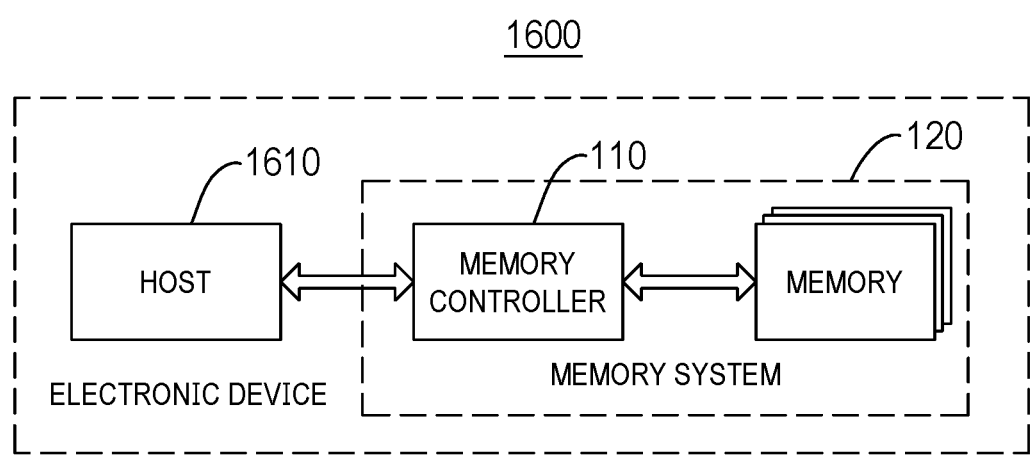
FIG. 16 is a schematic diagram of an electronic device provided by implementations of the present application.

In one possible implementation, as shown in FIG. 16, the implementations of the present application also provide an electronic device 1600 that includes a host 1610 and a memory system 100 coupled to the host. The memory controller 110 in memory system 100 is coupled to the host 1610. The memory controller 110 may manage data stored in the one or more memories 120 and communicate with the host 1610. The host 1610 may be a processor of electronic device 1600 (e.g., central processing unit (CPU)) or system on chip (SoC) (e.g., application processor (AP)). The host 1610 may be configured to send data to memory 120. Alternatively, the host 1610 may be configured to receive data from the memory 120. That is, the memory system 100 may be applied to and encapsulated in different types of electronic devices 1600, such as mobile phones (e.g., cellphones), desktop computers, tablet computers, notebook computers, servers, vehicle devices, game consoles, printers, positioning devices, wearable devices, smart sensors, power supplies, virtual reality (VR) devices, augmented reality (AR) devices, or any other suitable electronic device having storage therein.

The foregoing are only implementations of the present disclosure, but the scope of protection of the present disclosure is not limited thereto. Any variation or permutation readily contemplated by those skilled in the art within the scope of the present disclosure should be covered within the scope of protection of the present disclosure. Therefore, the scope of protection of this disclosure shall be subject to the scope of protection of the claims.

What is claimed is:

1. A method of controlling a memory system, comprising:
   obtaining a first soft-bit data corresponding to a hard-bit data read from a memory and a first lookup table, wherein the first lookup table comprises a first log-likelihood ratio determined based on a first reference read voltage of the memory;
   performing a first soft decoding operation according to the first log-likelihood ratio and the first soft-bit data; and
   performing at least one shift to the first log-likelihood ratio and performing a second soft decoding operation according to a log-likelihood ratio after each shift and the first soft-bit data when the first soft decoding operation is determined to have failed to decode.

2. The method of claim 1, wherein performing at least one shift to the first log-likelihood ratio and performing a second soft decoding operation according to the log-likelihood ratio after each shift and the first soft-bit data comprises:
   performing at least one positive shift to the first log-likelihood ratio and performing soft decoding according to the log-likelihood ratio after each shift and the first soft-bit data.

3. The method of claim 2, wherein when performing at least one positive shift to the first log-likelihood ratio and performing soft decoding according to the log-likelihood ratio after each shift and the first soft-bit data has failed, the method comprises:
   performing at least one negative shift to the first log-likelihood ratio and performing soft decoding according to the log-likelihood ratio after each shift and the first soft-bit data.

4. The method of claim 1, wherein performing at least one shift to the first log-likelihood ratio and performing a second soft decoding operation according to the log-likelihood ratio after each shift and the first soft-bit data comprises:
   performing at least one negative shift to the first log-likelihood ratio and performing soft decoding according to the log-likelihood ratio after each shift and the first soft-bit data.

5. The method of claim 4, wherein when performing at least one negative shift to the first log-likelihood ratio and performing soft decoding according to the log-likelihood ratio after each shift and the first soft-bit data has failed, the method comprises:
   performing at least one positive shift to the first log-likelihood ratio and performing soft decoding according to the log-likelihood ratio after each shift and the first soft-bit data.

6. The method of claim 1, wherein performing at least one shift to the first log-likelihood ratio and performing a second soft decoding operation according to the log-likelihood ratio after each shift and the first soft-bit data comprises:
   performing cross-shift to the first log-likelihood ratio and performing soft decoding according to the log-likelihood ratio after each shift and the first soft-bit data.

7. The method of claim 1, wherein each shift value is the same when performing at least one shift to the first log-likelihood ratio.

8. The method of claim 1, wherein each shift value is different when performing at least one shift to the first log-likelihood ratio.

9. The method of claim 1, further comprising:
   outputting corresponding decoded data when the second soft decoding operation is determined as being successful for decoding; and
   stopping performance of the second soft decoding operation when a count of shifts to the first log-likelihood ratio reaches a preset value.

10. The method of claim 9, wherein after stopping performing of the second soft decoding operation when a count of shifts to the first log-likelihood ratio reaches a preset value, the method further comprises:
    obtaining a second lookup table comprising a second log-likelihood ratio determined based on a second reference read voltage of the memory;
    offsetting the first reference read voltage to the second reference read voltage;
    reading a second soft-bit data of the memory according to the second reference read voltage; and
    performing a third soft decoding operation according to the second soft-bit data and the second log-likelihood ratio.

11. The method of claim 9, wherein after stopping performance of the second soft decoding operation when a count of shifts to the first log-likelihood ratio reaches a preset value, the method further comprises:
    obtaining a third lookup table comprising a third log-likelihood ratio determined based on a third reference read voltage of the memory; and
    performing a fourth soft decoding operation based on the third log-likelihood ratio and the first soft-bit data.

12. The method of claim 1, wherein obtaining a first soft-bit data corresponding to a hard-bit data read from the memory and a first lookup table is performed after a hard decoding operation on the hard-bit data fails to decode.

13. A computer-readable storage medium storing computer program instructions that, when executed by a processor, cause the processor to:
    obtain a first soft-bit data corresponding to a hard-bit data read from a memory and a first lookup table, wherein the first lookup table comprises a first log-likelihood ratio determined based on a first reference read voltage of the memory;
    perform a first soft decoding operation according to the first log-likelihood ratio and the first soft-bit data; and
    perform at least one shift to the first log-likelihood ratio and perform a second soft decoding operation according to a log-likelihood ratio after each shift and the first soft-bit data when the first soft decoding operation is determined as having failed to decode.

14. A memory system, comprising:
    one or more memories; and
    a memory controller coupled to the memories and configured to control the memories, wherein the memory controller comprises a decoding circuit;
    wherein the decoding circuit is configured to:

obtain a first soft-bit data corresponding to a hard-bit data read from a memory and a first lookup table, wherein the first lookup table comprises a first log-likelihood ratio determined based on a first reference read voltage of the memory;

perform a first soft decoding operation according to the first log-likelihood ratio and the first soft-bit data; and perform at least one shift to the first log-likelihood ratio and perform a second soft decoding operation according to a log-likelihood ratio after each shift and the first soft-bit data when the first soft decoding operation is determined as having failed to decode.

15. The memory system of claim 14, wherein when performing at least one shift to the first log-likelihood ratio and performing a second soft decoding operation according to the log-likelihood ratio after each shift and the first soft-bit data, the decoding circuit is configured to:

perform at least one positive shift to the first log-likelihood ratio and perform soft decoding according to the log-likelihood ratio after each shift and the first soft-bit data.

16. The memory system of claim 15, wherein when performing at least one positive shift to the first log-likelihood ratio and performing soft decoding according to the log-likelihood ratio after each shift and the first soft-bit data has failed, the decoding circuit is further configured to:

perform at least one negative shift to the first log-likelihood ratio and perform soft decoding according to the log-likelihood ratio after each shift and the first soft-bit data.

17. The memory system of claim 14, wherein when performing at least one shift to the first log-likelihood ratio and performing a second soft decoding operation according to the log-likelihood ratio after each shift and the first soft-bit data, the decoding circuit is configured to:

perform at least one negative shift to the first log-likelihood ratio and perform soft decoding according to the log-likelihood ratio after each shift and the first soft-bit data.

18. The memory system of claim 17, wherein when performing at least one negative shift to the first log-likelihood ratio and performing soft decoding according to the log-likelihood ratio after each shift and the first soft-bit data has failed, the decoding circuit is further configured to:

perform at least one positive shift to the first log-likelihood ratio, and perform soft decoding according to the log-likelihood ratio after each shift and the first soft-bit data.

19. The memory system of claim 14, wherein performing at least one shift to the first log-likelihood ratio and performing a second soft decoding operation according to the log-likelihood ratio after each shift and the first soft-bit data comprises:

performing cross-shift to the first log-likelihood ratio and performing soft decoding according to the log-likelihood ratio after each shift and the first soft-bit data.

20. The memory system of claim 14, wherein each shift value is the same when performing at least one shift to the first log-likelihood ratio.

* * * * *